US010311765B2

(12) United States Patent
Hao et al.

(10) Patent No.: US 10,311,765 B2
(45) Date of Patent: Jun. 4, 2019

(54) ELECTROSTATIC DISCHARGE (ESD) AND TESTING COMPOSITE COMPONENT, ARRAY SUBSTRATE AND DISPLAY DEVICE

(71) Applicant: BOE TECHNOLOGY GROUP CO., LTD., Beijing (CN)

(72) Inventors: Xueguang Hao, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 15/538,392

(22) PCT Filed: Nov. 15, 2016

(86) PCT No.: PCT/CN2016/105953
§ 371 (c)(1),
(2) Date: Jun. 21, 2017

(87) PCT Pub. No.: WO2017/185716
PCT Pub. Date: Nov. 2, 2017

(65) Prior Publication Data
US 2018/0218657 A1 Aug. 2, 2018

(30) Foreign Application Priority Data
Apr. 26, 2016 (CN) .................. 2016 2 0362982 U

(51) Int. Cl.
*G09G 3/00* (2006.01)
*G02F 1/1335* (2006.01)
(Continued)

(52) U.S. Cl.
CPC ............. *G09G 3/006* (2013.01); *G02F 1/136* (2013.01); *G02F 1/1335* (2013.01);
(Continued)

(58) Field of Classification Search
CPC ...................................................... G09G 3/006
See application file for complete search history.

(56) References Cited

U.S. PATENT DOCUMENTS

2006/0152245 A1* 7/2006 Ahn ................. G09G 3/006
324/760.02

FOREIGN PATENT DOCUMENTS

CN    1766722 A    5/2006
CN    101097673 A  1/2008
(Continued)

OTHER PUBLICATIONS

International Search Report dated Feb. 20, 2017.

*Primary Examiner* — Walter L Lindsay, Jr.
*Assistant Examiner* — Milton Gonzalez
(74) *Attorney, Agent, or Firm* — Dilworth & Barrese, LLP.; Michael J. Musella, Esq.

(57) ABSTRACT

An electrostatic discharge (ESD) and testing composite component, an array substrate and a display device are provided. The composite component includes a first signal line, a first thin-film transistor (TFT) and a second TFT which are electrically connected with the first signal line, a second signal line electrically connected with the first TFT, and a third signal line and a fourth signal line which are electrically connected with the second TFT; and the composite component is configured to provide a testing signal for the first signal line at a first stage and configured to provide ESD for the first signal line at a second stage, and the first stage is a testing stage and the second stage is an ESD stage. The composite component occupies small area and acquire a narrow-bezel and/or high-resolution display panel.

18 Claims, 6 Drawing Sheets

(51) Int. Cl.
*G02F 1/136* (2006.01)
*G09G 3/36* (2006.01)
*H01L 29/786* (2006.01)
*G02F 1/1362* (2006.01)
*G09G 3/3208* (2016.01)
*G02F 1/13* (2006.01)

(52) U.S. Cl.
CPC ......... *G02F 1/136204* (2013.01); *G09G 3/36* (2013.01); *H01L 29/786* (2013.01); *G02F 1/1309* (2013.01); *G02F 1/136286* (2013.01); *G09G 3/3208* (2013.01); *G09G 2330/04* (2013.01)

(56) References Cited

FOREIGN PATENT DOCUMENTS

| | | |
|---|---|---|
| CN | 101359024 A | 2/2009 |
| CN | 104021747 A | 9/2014 |
| CN | 203849977 U | 9/2014 |

* cited by examiner

ELECTROSTATIC DISCHARGE (ESD) AND TESTING COMPOSITE COMPONENT, ARRAY SUBSTRATE AND DISPLAY DEVICE

TECHNICAL FIELD

At least one embodiment of the present disclosure relates to an electrostatic discharge (ESD) and testing composite component, an array substrate and a display device.

BACKGROUND

In the structural design of a thin film transistor liquid crystal display (TFT-LCD), a testing unit and an ESD unit adopt the mode of separate design. In general, the testing unit is disposed at an edge of a data line, and the ESD unit is disposed at an edge of the data line or at four corners of a display. The testing unit and the ESD unit with separate design occupy large area, so that a narrow-bezel and/or high-resolution display panel cannot be acquired.

SUMMARY

At least one embodiment of the present disclosure provides an ESD and testing composite component, an array substrate and a display device, so as to occupy small area and acquire a narrow-bezel and/or high-resolution display panel.

Embodiments of the disclosure provide an electrostatic discharge (ESD) and testing composite component, wherein the composite component includes a first signal line, a first thin film transistor (TFT) and a second TFT which are electrically connected with the first signal line, a second signal line electrically connected with the first TFT, and a third signal line and a fourth signal line which are electrically connected with the second TFT; and the composite component is configured to provide a testing signal for the first signal line at a first stage and configured to provide ESD for the first signal line at a second stage.

Embodiments of the disclosure further provide an array substrate including the ESD and testing composite component provided by any one of the embodiments of the disclosure.

Embodiments of the disclosure further provide a display device including the array substrate provided by any one of the embodiments of the disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

Figure 1:
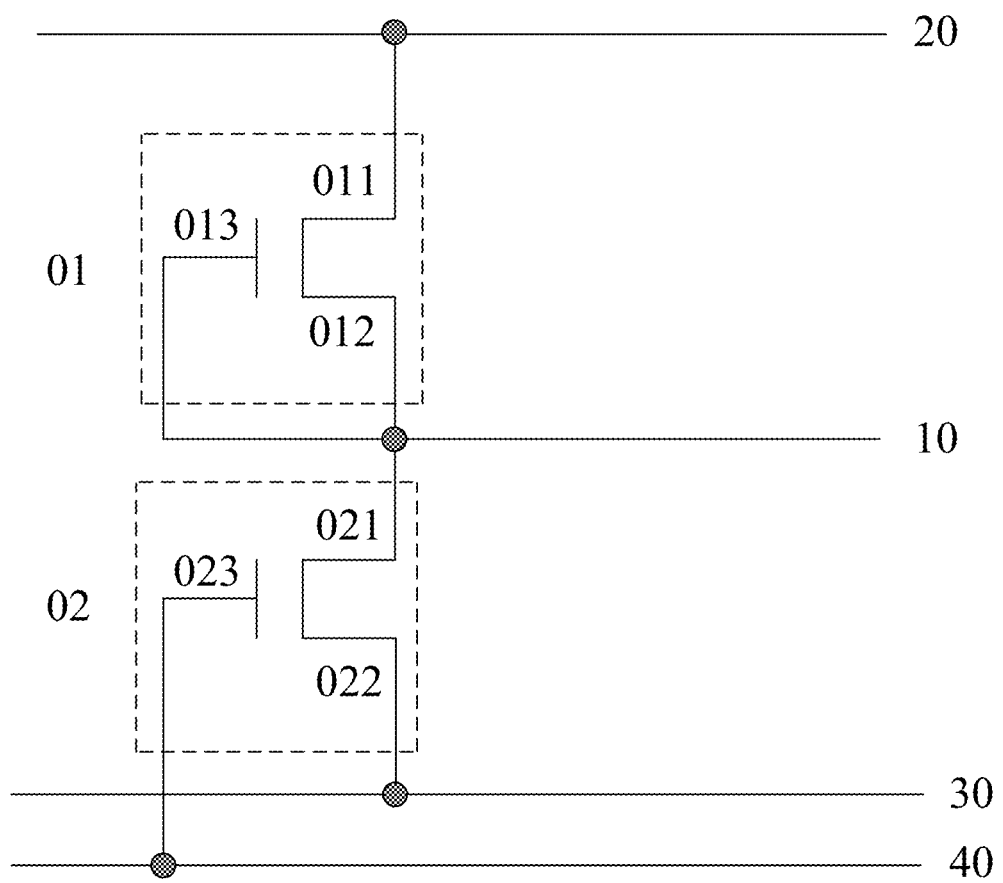
FIG. 1 is a schematic diagram of a circuit structure (equivalent circuit) of an ESD and testing composite component provided by an embodiment of the present disclosure.

10—first signal line; 01—first TFT; 02—second TFT; 03—third TFT; 20—second signal line; 30—third signal line; 40—fourth signal line; 50—fifth signal line; 60—sixth signal line; 70—seventh signal line; 011—first source electrode; 012—first drain electrode; 013—first gate electrode; 014—first active layer; 021—second source electrode; 022—second drain electrode; 023—second gate electrode; 024—second active layer; 101—first portion of the first signal line; 102—second portion of the first signal line; 1001—the $1^{st}$ first signal line; 1002—the $2^{nd}$ first signal line; 1003—the $N-1^{th}$ first signal line; 1004—the $N^{th}$ first signal line; 201—first portion of the second signal line; 301—first portion of the third signal line; 401—first portion of the fourth signal line; 031—third source electrode; 032—third drain electrode; 033—third gate electrode; 034—third active layer; 501—first portion of the fifth signal line; 100—display region; 200—peripheral region; 001—through hole; 002—connecting member.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a portion but not all of the embodiments of the disclosure. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

In the embodiments of the present disclosure, thin film transistor is abbreviated as TFT. Correspondingly, first thin film transistor is abbreviated as first TFT; second thin film transistor is abbreviated as second TFT; and third thin film transistor is abbreviated as third TFT. Moreover, in the embodiments of the present disclosure, a source electrode and a drain electrode are relative to each other and can be exchanged. For instance, in a case that the source electrode is replaced by the drain electrode, the drain electrode is also replaced by the source electrode. In the accompanying drawings, "S" represents source electrode and "D" represents drain electrode.

Taking a liquid crystal display (LCD) as an example, a testing unit of a liquid crystal cell is usually used as follows: (1) after the complete production of the cell of the display and before chip bonding, providing signals required for lighting through the testing unit of the cell by utilization of an electrical testing tool; (2) comprehensively evaluating the display effect and the electrical characteristics of the display after the display is lit; and (3) selecting nondefectives in the step (2) for chip bonding process, and discarding the testing unit of the cell after the completion of the process.

The embodiments of the present disclosure integrates the testing unit and the ESD unit into an ESD and testing composite component on the basis of this, so as to reduce the occupied area. In the embodiment of the present disclosure, at the testing stage, signals (high level or low level signals, etc.) can be provided for the ESD and testing composite component through an electrical testing tool; and at the ESD stage, signals (high level or low level signals, etc.) can be provided for the ESD and testing composite component through a chip.

Figure 5:
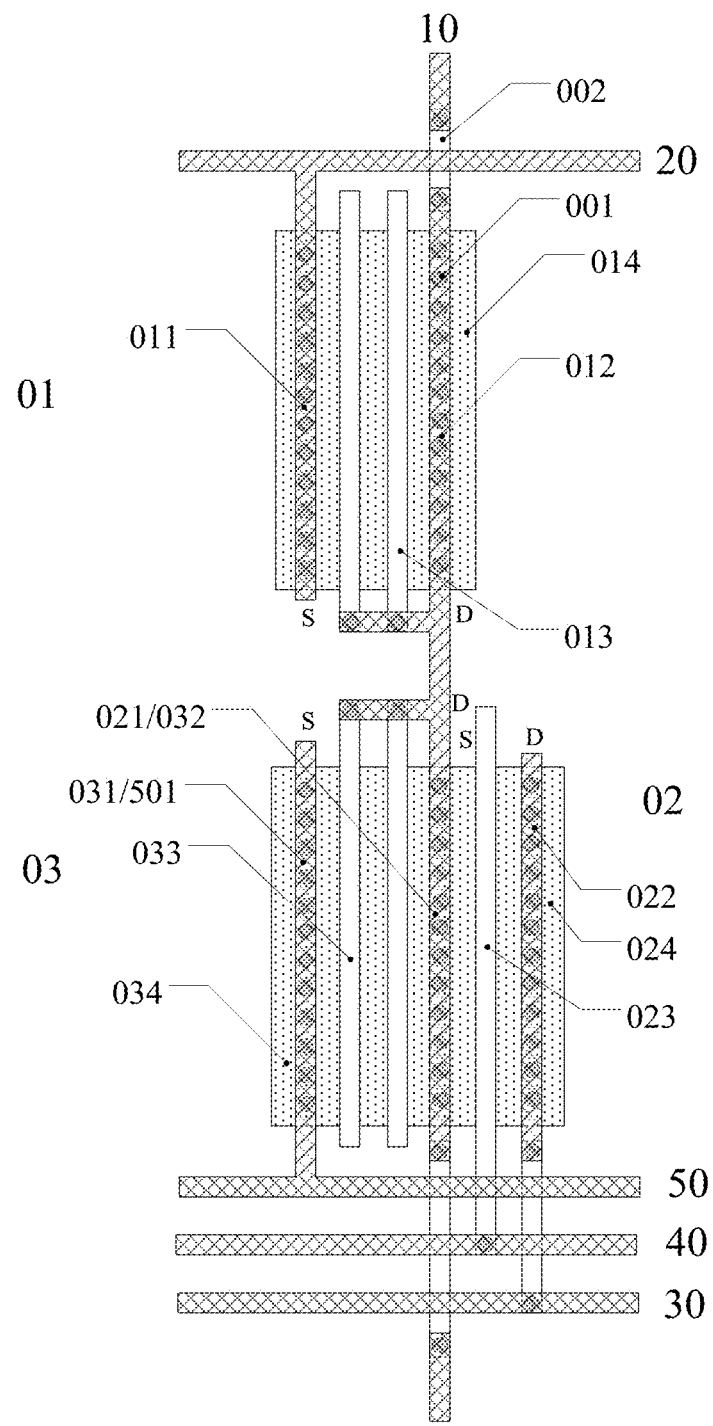
FIG. 5 is a schematic plan view of another ESD and testing composite component provided by an embodiment of the present disclosure.

At least one embodiment of the present disclosure provides an ESD and testing composite component. As illustrated in FIGS. 1 and 5, the composite element includes a first signal line 10, a first TFT 01 and a second TFT 02 which are electrically connected with the first signal line 10, a second signal line 20 electrically connected with the first TFT 01, and a third signal line 30 and a fourth signal line 40 which are electrically connected with the second TFT 02. The composite element is configured to provide a testing signal for the first signal line 10 at a first stage and configured to provide ESD for the first signal line 10 at a second stage. In the embodiment of the present disclosure, the first stage is testing stage and the second stage is ESD stage. For instance, the testing stage refers to the stage of testing the display before chip bonding, and the ESD stage refers to the stage of performing ESD on static charges accumulated on the first signal line after chip bonding. The ESD and testing composite component occupies small area, so that a narrow-bezel and/or high-resolution display panel can be obtained.

Description will be given below with reference to several preferred embodiments. It should be noted that: in the following embodiments, in an N-type TFT, a source electrode is in low level; a drain electrode is in high level; and the N-type TFT can be switched on by positive gate voltage (the voltage difference between the gate electrode and the source electrode is greater than 0). In a P-type TFT, a source electrode is in high level; a drain electrode is in low level; and the P-type TFT can be switched on by negative gate voltage (the voltage difference between the gate electrode and the source electrode is less than 0). Description is given in the embodiment of the present disclosure by taking the case that a drain electrode and a gate electrode are electrically connected to form a diode as an example. The gate electrode can be electrically connected with the drain electrode to form the diode. Or although the gate electrode and the drain electrode are connected with different signal lines, the signal line connected with the gate electrode and the signal line connected with the drain electrode can be connected with the same signal, so that the structure of the diode can be formed. Description is given in the embodiment of the present disclosure by taking the case as an example, but is not limited thereto.

First Embodiment

Figure 2:
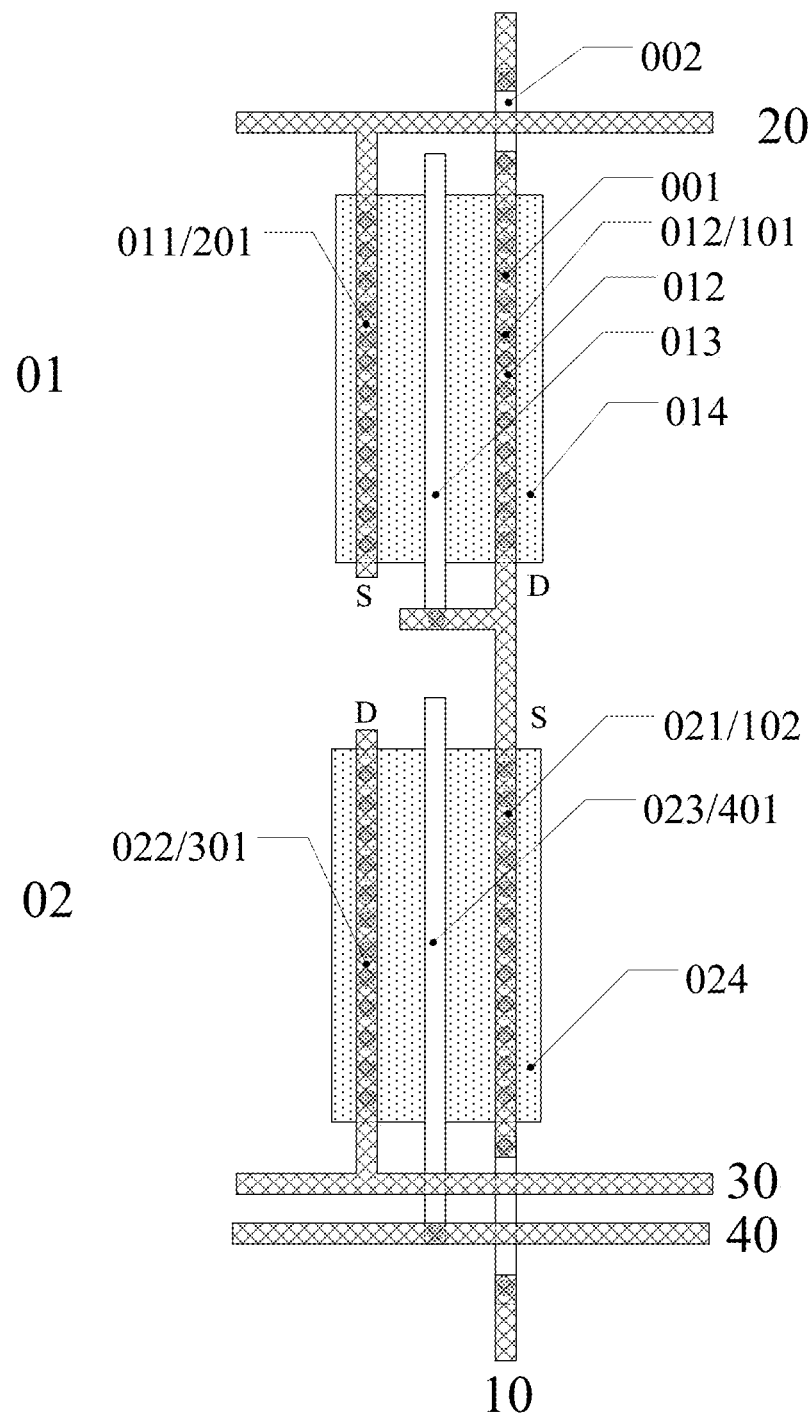
FIG. 2 is a schematic plan view of the ESD and testing composite component provided by an embodiment of the present disclosure.

The embodiment provides an ESD and testing composite component. As illustrated in FIGS. 1 and 2, the composite element includes a first signal line 10, a first TFT 01 and a second TFT 02 which are electrically connected with the first signal line 10, a second signal line 20 electrically connected with the first TFT 01, and a third signal line 30 and a fourth signal line 40 which are electrically connected with the second TFT 02. The composite element is configured to provide a testing signal for the first signal line 10 at a first stage and configured to provide ESD for the first signal line 10 at a second stage. The first stage is testing stage and the second stage is ESD stage. The first TFT 01, the second TFT 02, the second signal line 20, the third signal line 30 and the fourth signal line 40 not only have ESD function but also have testing function. That is to say, at the testing stage, the first TFT 01, the second TFT 02, the second signal line 20, the third signal line 30 and the fourth signal line 40 have testing function; and at the ESD stage, the first TFT 01, the second TFT 02, the second signal line 20, the third signal line 30 and the fourth signal line 40 have ESD function.

The embodiment adopts the composite design of testing and ESD, converts the testing unit discarded after bonding process into an ESD protective unit, widens the layout space, and is favorable for the design of narrow-bezel and high-resolution products.

For instance, signals required for lighting can be provided for the display panel through the ESD and testing composite component provided by the embodiment by utilization of an electrical testing tool. In some examples, as illustrated in FIGS. 1 and 2, at the testing stage, the second signal line 20, the third signal line 30 and the fourth signal line 40 are high level signal lines, and the first TFT 01 and the second TFT 02 are switched on and transmit testing signals applied to the second signal line 20 and the third signal line 30 to the first signal line 10. It should be noted that: in some other examples, the second signal line 20, the third signal line 30 and the fourth signal line 40 can also be low level signal lines. No limitation will be given here in the embodiment of the present disclosure.

For instance, at the first stage, the first TFT and the second TFT are configured to be switched on in a case that a first level or a second level signal is applied to the second signal line, the third signal line and the fourth signal line, and transmit the first level or second level signal applied to the second signal line and the third signal line to the first signal line for testing. For instance, first level refers to high level and second level refers to low level.

Subsequently, nondefectives after being tested are subjected to chip bonding process. For instance, in the ESD and testing composite component provided by the embodiment, as illustrated in FIG. 2, the second signal line 20 is connected with a high level (VGH) pin of a chip, and the third signal line 30 and the fourth signal line 40 are connected with a low level (VGL) pin of the chip. Or in some other examples, in the ESD and testing composite component provided by the embodiment, the second signal line 20 can also be connected with the VGL pin of the chip, and the third signal line 30 and the fourth signal line 40 can be connected with the VGH pin of the chip. In some examples, as illustrated in FIGS. 1 and 2, at the ESD stage, the second signal line 20 is a high level signal line, and the third signal line 30 and the fourth signal line 40 are low level signal lines, so that static charges accumulated on the first signal line 10 can be led out through the first TFT 01 and the second signal line 20 or through the second TFT 02 and the third signal line 30. It should be noted that: in some other examples, the second signal line 20 can also be a low level signal line, and the third signal line 30 and the fourth signal line 40 can be high level signal lines, so that the static charges accumulated on the first signal line 10 can be led out through the first TFT 01 and the second signal line 20 or through the second TFT 02 and the third signal line 30. No limitation will be given here in the embodiment of the present disclosure.

Positive or negative static charges can be accumulated on the first signal line. For instance, the first signal line can be a data line, a gate line, a clock signal line or the like in an array substrate. No limitation will be given here. The array substrate, for instance, is a substrate for forming an LCD panel or an OLED display panel, and no limitation will be given here, as long as the array substrate includes signal lines for ESD. Taking an LCD panel as an example, a single display panel can be manufactured by the array production process and the cell assembly process. The step adopts the industry's usual process. No further description will be given here.

For instance, in the embodiment of the present disclosure, positive static charges accumulated on the first signal line are released through a high level signal line, and negative static charges accumulated on the first signal line are released through a low level signal line. For instance, in the case of releasing the static charges, the charges are led out through one TFT and a high level signal line or a low level signal line connected with the TFT. For instance, the static charges are released to the second signal line through the first TFT or released to the third signal line through the second TFT. For instance, at the second stage, the first TFT and the second signal line are configured to lead out the static charges accumulated on the first signal line in a case that a first level signal is applied to the second signal line and a second level signal is applied to the third signal line and the fourth signal line, and the second TFT and the third signal line are configured to lead out the static charges accumulated on the first signal line in a case that the second level signal is applied to the second signal line and the first level signal is applied to the third signal line and the fourth signal line. For instance, first level refers to high level and second level refers to low level.

In some examples, as illustrated in FIGS. 1 and 2, the first TFT 01 is an N-type TFT and the second TFT 02 is an N-type TFT. It should be noted that: in some other examples, the first TFT 01 can also be a P-type TFT and the second TFT 02 can be a P-type TFT, or the first TFT 01 is an N-type TFT and the second TFT 02 is a P-type TFT, or the first TFT 01 is a P-type TFT and the second TFT 02 is an N-type TFT. No limitation will be given here in the embodiment of the present disclosure.

In some examples, as illustrated in FIGS. 1 and 2, the first TFT 01 includes a first source electrode 011, a first drain electrode 012, a first gate electrode 013 and a first active layer 014; the first signal line 10 is electrically connected with the first drain electrode 012; the second signal line 20 is electrically connected with the first source electrode 011; and the first gate electrode 013 is electrically connected with the first drain electrode 012. It should be noted that: in some other examples, the first signal line 10 can also be electrically connected with the first source electrode 011, and the second signal line 20 can be electrically connected with the first drain electrode 012. No limitation will be given here in the embodiment of the present disclosure.

In some examples, as illustrated in FIGS. 1 and 2, the second TFT 02 includes a second source electrode 021, a second drain electrode 022, a second gate electrode 023 and a second active layer 024; the first signal line 10 is electrically connected with the second source electrode 021; the third signal line 30 is electrically connected with the second drain electrode 022; and the second gate electrode 023 is electrically connected with the fourth signal line 40. It should be noted that: in some other examples, the first signal line 10 can also be electrically connected with the second drain electrode 022, and the third signal line 30 can be electrically connected with the second source electrode 021.

In the embodiment of the present disclosure, one TFT includes a source electrode, a drain electrode, a gate electrode and an active layer, and the source electrode and the drain electrode are respectively disposed on both sides of the active layer. In some examples, the source electrode and the drain electrode can be directly electrically connected with the active layer and can also be electrically connected with the active layer via through holes. As illustrated in FIG. 2, the first source electrode 011 and the first drain electrode 012 are respectively electrically connected with the first active layer 014 via through holes, and the second source electrode 021 and the second drain electrode 022 are respectively electrically connected with the second active layer 024 via through holes.

It should be noted that: in the embodiment of the present disclosure, if there are intersections among the first signal line, the second signal line, the third signal line, the fourth signal line and other signal lines, one signal line can be disconnected at the intersection; a connecting member is disposed in another conductive layer; and both ends of the connecting member can be electrically connected with both ends of the disconnected signal line via insulating layer through holes.

Description is given in FIG. 2 by taking the case that the first gate electrode 013 and the second gate electrode 023 are formed in the same layer and the first signal line 10, the second signal line 20, the third signal line 30 and the fourth signal line 40 are formed in the same layer as an example. An insulating layer can be disposed between a layer provided with the first gate electrode 013 and the second gate electrode 023 and a layer provided with the first signal line 10, the second signal line 20, the third signal line 30 and the fourth signal line 40. Two intersected signal lines can be electrically connected with each other through a connecting member. For instance, the first signal line 10 is disconnected at a position at which the first signal line is intersected with the second signal line 20, and is electrically connected with the disconnected position through a through hole 001 and a connecting member 002 in the same layer with the first gate electrode 013 and the second gate electrode 023. It should be noted that the embodiment of the present disclosure is not limited thereto.

It should be noted that no limitation will be given to the electrical connection mode in the embodiment of the present disclosure. For instance, direct electrical connection or integral forming can be adopted, or electrical connection via through holes can also be adopted, as long as electrical connection can be achieved.

In some examples, the first signal line 10 includes a first portion 101; the second signal line 20 includes a first portion 201; the first portion 101 of the first signal line 10 also serves as the first drain electrode 012; and the first portion 201 of the second signal line 20 also serves as the first source electrode 011. It should be noted that: in some other examples, the first portion 101 of the first signal line 10 can also be served as the first source electrode 011, and the first portion 201 of the second signal line 20 can be served as the first drain electrode 012. No limitation will be given here in the embodiment of the present disclosure.

In some examples, the first signal line 10 includes a second portion 102; the third signal line 30 includes a first portion 301; the second portion 102 of the first signal line 10 also serves as the second source electrode 021; and the first portion 301 of the third signal line 30 also serves as the second drain electrode 022. It should be noted that: in some other examples, the second portion 102 of the first signal line 10 can also be served as the second drain electrode 022, and the first portion 301 of the third signal line 30 can be served as the second source electrode 021. No limitation will be given here in the embodiment of the present disclosure.

In some examples, the fourth signal line 40 includes a first portion 401; and the first portion 401 of the fourth signal line 40 also serves as the second gate electrode 023.

It should be noted that FIG. 2 is only enumerated but not limited. For instance, the first portion of the second signal line 20 in FIG. 2 can also be served as the first drain electrode 012, and the first gate electrode is electrically connected with the first portion (the first drain electrode 012) of the second signal line 20. In this case, the first TFT 01 and the second TFT are P-type TFTs. At the testing stage, the second signal line 20, the third signal line 30 and the fourth signal line 40 can be low level signal lines, and the first TFT 01 and the second TFT 02 are switched on and transmit testing signals applied to the second signal line 20 and the third signal line 30 to the first signal line 10. At the ESD stage, the second signal line 20 is a low level signal line, and the third signal line 30 and the fourth signal line 40 are high level signal lines, so that the static charges accumulated on the first signal line 10 can be led out through the first TFT 01 and the second signal line 20 or through the second TFT 02 and the third signal line 30.

Figure 3:
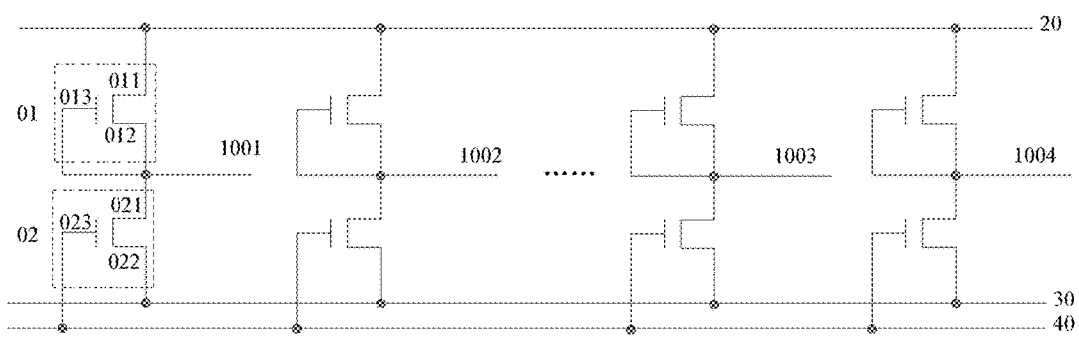
FIG. 3 is a schematic plan view of an ESD and testing composite component group provided by an embodiment of the present disclosure.
Figure 4:
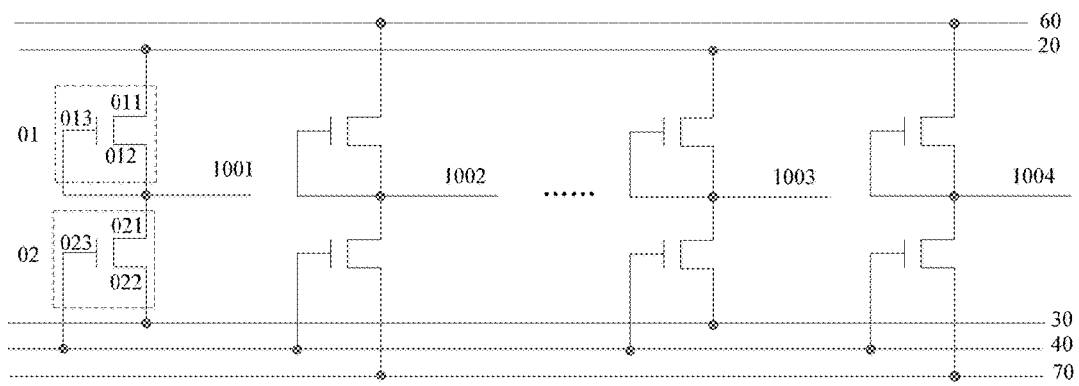
FIG. 4 is a schematic plan view of another ESD and testing composite component group provided by an embodiment of the present disclosure.

In some examples, an ESD and testing composite component group formed by a plurality of the first signal lines 10 can be as illustrated in FIG. 3; each first signal line is any ESD and testing composite component structure provided by the embodiment, or as illustrated in FIG. 4, an odd column and an even column are respectively any ESD and testing composite component structure provided by the embodiment. For instance, the odd column corresponds to the second signal line 20, the third signal line 30 and the fourth signal line 40, and the even column corresponds to a sixth signal line 60, the fourth signal line 40 and a seventh signal line 70. FIGS. 3 and 4 only illustrate the 1$^{st}$ first signal line 1001, the 2$^{nd}$ first signal line 1002, the N−1$^{th}$ first signal line 1003 and the N$^{th}$ first signal line 1004.

For instance, the embodiment further provides a method for manufacturing an ESD and testing composite component. The method includes the following steps: (1) forming a buffer layer on a base substrate; (2) forming a semiconductor layer on the buffer layer, in which the semiconductor layer 003 includes patterns of a first active layer 014 and a second active layer 024; (3) forming a gate insulating layer on the semiconductor layer; (4) forming patterns of a first gate electrode 013 and a second gate electrode 023 on the gate insulating layer; (5) forming through holes in the gate insulating layer; (6) forming patterns of a first source electrode 011 and a first drain electrode 012 of a first TFT 01, a second source electrode 021 and a second drain electrode 022 of a second TFT 02, and portions of a first signal line, a second signal line, a third signal line and a fourth signal line, arranged in the same layer, on the gate insulating layer provided with the through holes; (7) forming an interlayer insulating layer, forming via holes (through holes) in the interlayer insulating layer, and forming patterns of connecting members on the interlayer insulating layer provided with the via holes, so as to electrically connect signal lines disconnected at intersections.

It should be noted that the method for manufacturing the ESD and testing composite component, provided by the embodiment of the present disclosure, is not limited to the method described above.

Second Embodiment

The difference between the ESD and testing composite component provided by the embodiment and the first embodiment is that: as illustrated in FIG. 5, the ESD and testing composite component further includes a third TFT 03 electrically connected with the first signal line 10 and a fifth signal line 50 electrically connected with the third TFT 03. The second TFT 02, the third signal line 30 and the fourth signal line 40 are configured to provide a testing signal for the first signal line 10 at the first stage, and the first TFT 01, the third TFT 03, the second signal line 20 and the fifth signal line 50 are configured to provide ESD for the first signal line 10 at the second stage. The first stage is a testing stage and the second stage is an ESD stage. That is to say, at the testing stage, the second TFT 02, the third signal line 30 and the fourth signal line 40 have testing function; and at the ESD stage, the first TFT 01, the third TFT 03, the second signal line 20 and the fifth signal line 50 have ESD function.

In some examples, as illustrated in FIG. 5, the third TFT 03 includes a third source electrode 031, a third drain electrode 032, a third gate electrode 033 and a third active layer 034; the fifth signal line 50 is electrically connected with the third source electrode 031; the first signal line 10 is electrically connected with the third drain electrode 032; the third gate electrode 033 is electrically connected with the third drain electrode 032; and the second source electrode 021 of the second TFT 02 also serves as the third drain electrode 032 of the third TFT 03. It should be noted that: in some other examples, the fifth signal line 50 can also be electrically connected with the third drain electrode 032, and the first signal line 10 can be electrically connected with the third source electrode 031. No limitation will be given here in the embodiment of the present disclosure. In some other examples, the second source electrode 021 of the second TFT 02 can be served as the third drain electrode 032 of the third TFT 03, or the second drain electrode 022 of the second TFT 02 can be served as the third source electrode 031 of the third TFT 03, or the second drain electrode 022 of the second TFT 02 can be served as the third drain electrode 032 of the third TFT 03. No limitation will be given here in the embodiment of the present disclosure. For instance, the third source electrode 031 and the third drain electrode 032 are respectively electrically connected with the third active layer 034 via through holes.

In some examples, the second TFT 02 is a P-type TFT. As illustrated in FIG. 5, at the testing stage, the third signal line 30 and the fourth signal line 40 are low level signal lines, and the second TFT 02 is switched on and transmits the testing signal applied to the third signal line 30 to the first signal line 10. It should be noted that: in some other examples, at the testing stage, the third signal line 30 and the fourth signal line 40 can be high level signal lines. No limitation will be given here in the embodiment of the present disclosure.

In some examples, as illustrated in FIG. 5, the first TFT 01 is an N-type TFT and the third TFT 03 is a P-type TFT. At the ESD stage, the second signal line 20 is a high level signal line and the fifth signal line 50 is a low level signal line, so that static charges accumulated on the first signal line 10 can be led out through the first TFT 01 and the second signal line 20 or through the third TFT 03 and the fifth signal line 50. For instance, positive static charges accumulated on the first signal line 10 are led out through the first TFT 01 and the second signal line 20, and negative static charges accumulated on the first signal line 10 are led out through the third TFT 03 and the fifth signal line 50. It should be noted that: in some other examples, the second signal line 20 can also be a low level signal line and the fifth signal line 50 can be a high level signal line. No limitation will be give here in the embodiment of the present disclosure.

In some examples, as illustrated in FIG. 5, the fifth signal line 50 includes a first portion 501; and the first portion 501 of the fifth signal line 50 also serves as the third source electrode 031 or the third drain electrode 032.

In some examples, as illustrated in FIG. 5, the third signal line 30 and the fourth signal line 40 are low level signal lines together with the fifth signal line 50. It should be noted that: in some other examples, the third signal line 30 and the fourth signal line 40 can be high level signal lines together with the fifth signal line 50. No limitation will be given here in the embodiment of the present disclosure.

Figure 6:
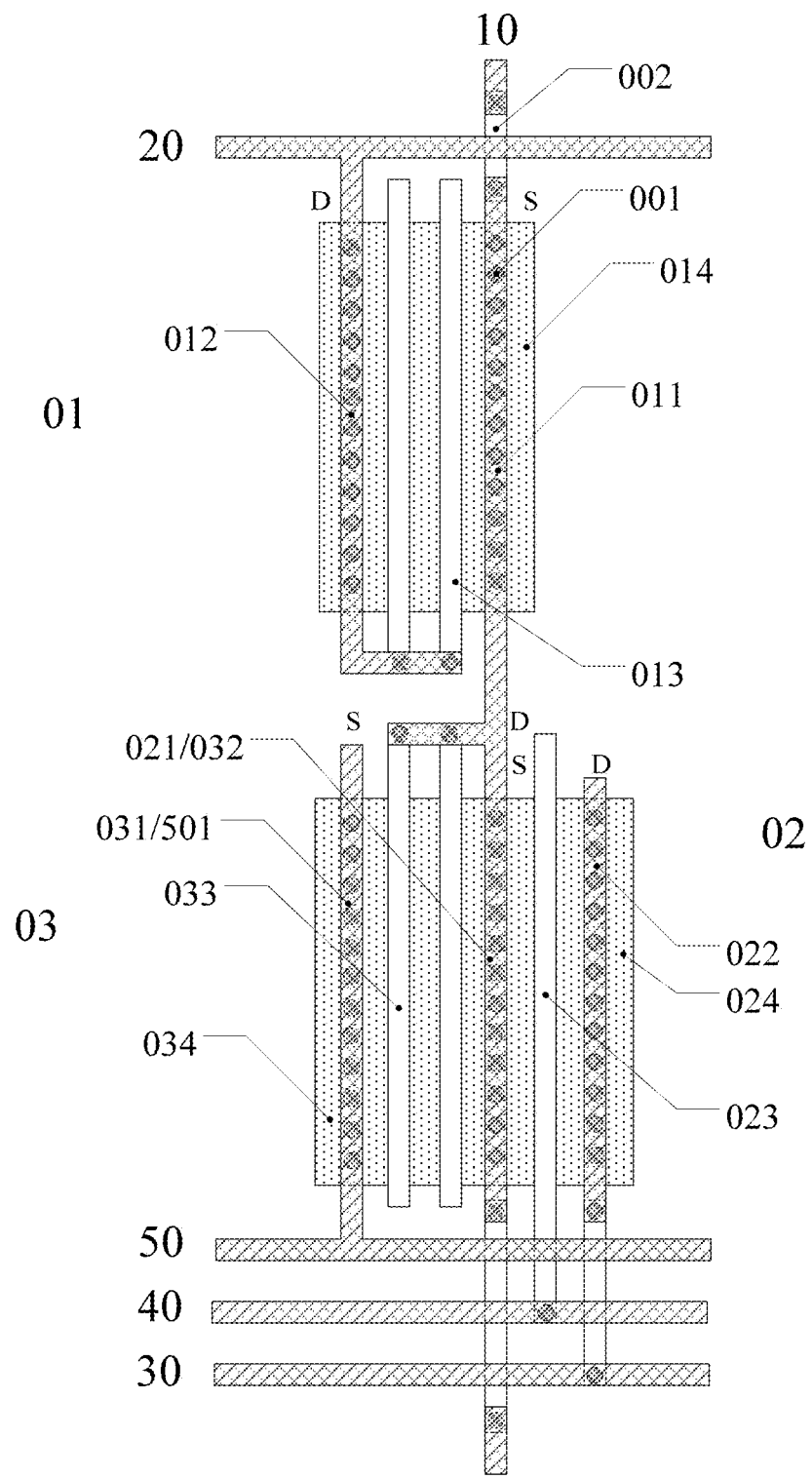
FIG. 6 is a schematic plan view of still another ESD and testing composite component provided by an embodiment of the present disclosure.

In some examples, as illustrated in FIG. 6, the third TFT 03 is an N-type TFT; the first TFT 01 and the second TFT 02 are also N-type TFTs; and the second source electrode 021 of the second TFT 02 also serves as the third drain electrode 032 of the third TFT 03. At the testing stage, the third signal line 30 and the fourth signal line 40 are high level signal lines, and the second TFT 02 is switched on and transmits the testing signal applied to the third signal line 30 to the first signal line 10. At the ESD stage, the second signal line 20 is a low level signal line, and the third signal line 30 and the fourth signal line 40 are high level signal lines together with the fifth signal line 50. Thus, static charges accumulated on the first signal line 10 can be led out through the first TFT 01 and the second signal line 20 or through the third TFT 03 and the fifth signal line 50. For instance, positive static charges accumulated on the first signal line 10 are led out through the third TFT 03 and the fifth signal line 50, and negative static charges accumulated on the first signal line 10 are led out through the first TFT 01 and the second signal line 20.

Third Embodiment

The embodiment provides an array substrate, which includes any foregoing ESD and testing composite component provided by the first embodiment or the second embodiment.

Figure 7:
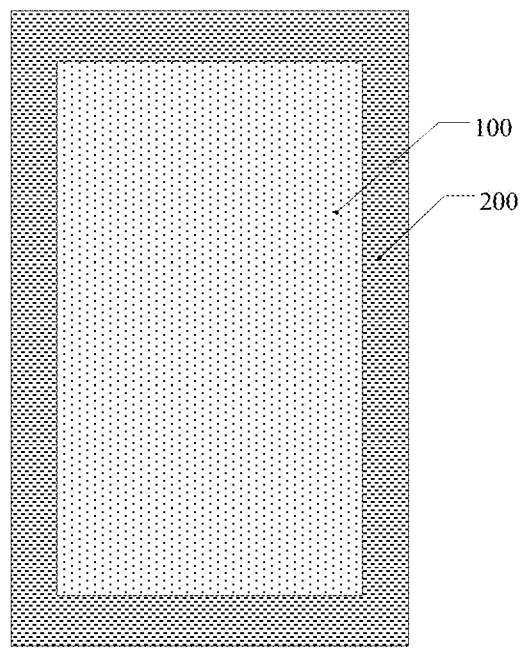
FIG. 7 is a schematic diagram of a display region and a peripheral region of an array substrate provided by an embodiment of the present disclosure.

In some examples, as illustrated in FIG. 7, the array substrate includes a display region 100 and a peripheral region 200 disposed on an outside of the display region 10.

The ESD and testing composite component can be disposed in the peripheral region 200. For instance, the peripheral region can be disposed on at least one side of the display region, or the peripheral region can encircle the display region. For instance, the display region is disposed in the middle of the array substrate and, for instance, is encircled by a non-display region. The display region includes a plurality of subpixel units arranged in an array, and each subpixel unit includes a TFT taken as a switching element. For instance, the display region can also be provided with pixel electrodes and the like electrically connected with drain electrodes of the TFTs. No further description will be given here.

Fourth Embodiment

The embodiment provides a display device, which includes any foregoing array substrate provided by the third embodiment.

The display device can be a display device such as an LCD, e-paper and an OLED display or any product or component with display function including the display device, e.g., a TV, a digital camera, a mobile phone, a watch, a tablet PC, a notebook computer and a navigating device.

The following is to be noted.

(1) The same reference numerals denote the same elements/components unless otherwise defined.

(2) Only the structures involved in the embodiments of the present disclosure are involved in the embodiments and drawings of the present disclosure, other structures can refer to usual designs.

(3) In order to clearly illustrate, a layer or an area may be amplified in the drawings of the embodiments of the present disclosure. It is to be understood that, when a member such as a layer, a film, an area or a substrate is located or disposed on or below another member, the member can be located or disposed on or below the another member directly, or an intermediate member or intermediate member(s) can be disposed.

(4) The features in different embodiments or different features in the same embodiments can be combined without conflict.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

This application claims the benefit of priority from Chinese patent application No. 201620362982.3, filed on Apr. 26, 2016, the disclosure of which is incorporated herein in its entirety by reference as a portion of the present application.

What is claimed is:

1. An electrostatic discharge (ESD) and testing composite component, wherein the composite component comprises a first signal line, a first thin-film transistor (TFT) and a second TFT which are electrically connected with the first signal line, a second signal line electrically connected with the first TFT, and a third signal line and a fourth signal line which are electrically connected with the second TFT; and the composite component is configured to provide a testing signal for the first signal line at a first stage and configured to provide ESD for the first signal line at a second stage, and the ESD and testing composite component further comprising a third TFT electrically connected with the first signal line and a fifth signal line electrically connected with the third TFT, wherein the second TFT, the third signal line and the fourth signal line are configured to provide a testing signal for the first signal line at the first stage, and the first TFT, the third TFT, the second signal line and the fifth signal line are configured to provide ESD for the first signal line at the second stage.

2. The ESD and testing composite component according to claim 1, wherein at the first stage, the first TFT and the second TFT are configured to be switched on in a case that a first level or a second level signal is applied to the second signal line, the third signal line and the fourth signal line, and transmit the first level or second level signal applied to the second signal line and the third signal line to the first signal line for testing.

3. The ESD and testing composite component according to claim 1, wherein at the second stage, the first TFT and the second signal line are configured to lead out static charges accumulated on the first signal line in a case that a first level signal is applied to the second signal line and a second level signal is applied to the third signal line and the fourth signal line; and the second TFT and the third signal line are configured to lead out the static charges accumulated on the first signal line in a case that the second level signal is applied to the second signal line and the first level signal is applied to the third signal line and the fourth signal line.

4. The ESD and testing composite component according to claim 1, wherein the first TFT is an N-type TFT or a P-type TFT; and the second TFT is an N-type TFT or a P-type TFT.

5. An array substrate, comprising the ESD and testing composite component according to claim 1.

6. The array substrate according to claim 5, wherein the array substrate comprises a display region and a peripheral region disposed on an outside of the display region; and the ESD and testing composite component is disposed in the peripheral region.

7. A display device, comprising the array substrate according to claim 5.

8. The display device according to claim 7, wherein the display device comprises a liquid crystal display (LCD) device or an organic light-emitting diode (OLED) display device.

9. An electrostatic discharge (ESD) and testing composite component, wherein the composite component comprises a first signal line, a first thin-film transistor (TFT) and a second TFT which are electrically connected with the first signal line, a second signal line electrically connected with the first TFT, and a third signal line and a fourth signal line which are electrically connected with the second TFT; and the composite component is configured to provide a testing signal for the first signal line at a first stage and configured to provide ESD for the first signal line at a second stage;
wherein the first TFT comprises a first gate electrode, a first source electrode and a first drain electrode, the first signal line is electrically connected with the first drain electrode and the second signal line is electrically connected with the first source electrode, or the first signal line is electrically connected with the first source electrode and the second signal line is electrically connected with the first drain electrode, and the first gate electrode is electrically connected with the first drain electrode or the first source electrode,
wherein the second TFT comprises a second gate electrode, a second source electrode and a second drain electrode, the first signal line is electrically connected with the second source electrode and the third signal line is electrically connected with the second drain electrode, or the first signal line is electrically connected with the second drain electrode and the third signal line is electrically connected with the second source electrode, and the second gate electrode is electrically connected with the fourth signal line, and
wherein the ESD and testing composite component further comprises a third TFT electrically connected with the first signal line and a fifth signal line electrically connected with the third TFT, the second TFT, the third signal line and the fourth signal line are configured to provide a testing signal for the first signal line at the first stage, and the first TFT, the third TFT, the second signal line and the fifth signal line are configured to provide ESD for the first signal line at the second stage.

10. The ESD and testing composite component according to claim 9, wherein the third TFT comprises a third gate electrode, a third source electrode and a third drain electrode; the fifth signal line is electrically connected with the third source electrode and the first signal line is electrically connected with the third drain electrode, or the fifth signal line is electrically connected with the third drain electrode and the first signal line is electrically connected with the third source electrode; the third gate electrode is electrically connected with the third drain electrode or the third source electrode; and the second drain electrode or the second source electrode of the second TFT also serves as the third source electrode or the third drain electrode of the third TFT.

11. The ESD and testing composite component according to claim 10, wherein at the testing stage, the third signal line and the fourth signal line are high level signal lines or low level signal lines, and the second TFT is switched on and transmits a testing signal applied to the third signal line to the first signal line.

12. The ESD and testing composite component according to claim 10, wherein the fifth signal line comprises a first portion; and the first portion of the fifth signal line also serves as the third source electrode or the third drain electrode.

13. The ESD and testing composite component according to claim 9, wherein at the ESD stage, the second signal line is a low level signal line and the fifth signal line is a high level signal line, or the second signal line is a high level signal line and the fifth signal line is a low level signal line, so that static charges accumulated on the first signal line are led out through the first TFT and the second signal line or through the third TFT and the fifth signal line.

14. The ESD and testing composite component according to claim 9, wherein the third signal line and the fourth signal line are high level signal lines or low level signal lines together with the fifth signal line.

15. The ESD and testing composite component according to claim 9, wherein the third TFT is an N-type TFT or a P-type TFT.

16. The ESD and testing composite component according to claim 9, wherein the first signal line comprises a first portion; the second signal line comprises a first portion; the first portion of the first signal line also serves as the first drain electrode and the first portion of the second signal line also serves as the first source electrode; or the first portion of the first signal line also serves as the first source electrode and the first portion of the second signal line also serves as the first drain electrode.

17. The ESD and testing composite component according to claim 9, wherein the first signal line comprises a second portion; the third signal line comprises a first portion; the second portion of the first signal line also serves as the second source electrode, and the first portion of the third signal line also serves as the second drain electrode; or the second portion of the first signal line also serves as the second drain electrode, and the first portion of the third signal line also serves as the second source electrode.

18. The ESD and testing composite component according to claim 9, wherein the fourth signal line comprises a first portion; and the first portion of the fourth signal line also serves as the second gate electrode.

* * * * *